United States Patent
Sperber et al.

(10) Patent No.: US 11,413,969 B2
(45) Date of Patent: Aug. 16, 2022

(54) CONTROL APPARATUS FOR OPERATING AN ELECTRIC DRIVE FOR A VEHICLE AND METHOD OF MANUFACTURING SUCH A CONTROL APPARATUS

(71) Applicant: ZF Friedrichshafen AG, Friedrichshafen (DE)

(72) Inventors: Michael Sperber, Bayreuth (DE); Stefan Hain, Haag (DE); ChandraGupta Hazarika, Dibrugarh (IN)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/030,745

(22) Filed: Sep. 24, 2020

(65) Prior Publication Data
US 2021/0094424 A1    Apr. 1, 2021

(30) Foreign Application Priority Data
Sep. 26, 2019   (DE) .......................... 102019214789.5

(51) Int. Cl.
*H05K 7/20* (2006.01)
*B60L 15/00* (2006.01)

(52) U.S. Cl.
CPC ............ *B60L 15/007* (2013.01); *H05K 7/209* (2013.01); *B60L 2210/44* (2013.01); *B60L 2240/525* (2013.01)

(58) Field of Classification Search
CPC .............. B60L 15/007; B60L 2210/40; B60L 2210/42; B60L 2210/44; B60L 2240/525; H01H 9/52; H02M 7/003; H02M 7/5387; H02M 7/53871; H02M 7/53873; H02M 7/53875; H05K 7/1432; H05K 7/20; H05K 7/20845; H05K 7/2089; H05K 7/209; H05K 7/20909; H05K 7/20918; H05K 7/20927; H05K 7/20936; H05K 7/20945

See application file for complete search history.

(56) References Cited

U.S. PATENT DOCUMENTS

| 9,961,808 B2 * | 5/2018 | Lei ........................ H02M 7/003 |
| 2003/0075784 A1 * | 4/2003 | Nakase ................. H01L 23/473 257/675 |

(Continued)

FOREIGN PATENT DOCUMENTS

DE    10 2016 202 547 A1    8/2017

OTHER PUBLICATIONS

Office Action dated Mar. 17, 2021 for German Patent Application No. 10 2019 214 789.5, (12 pp. ), note: pp. 1 and 2 are English language Explanations to Section C. Result of Determination Document.

*Primary Examiner* — Levi Gannon
(74) *Attorney, Agent, or Firm* — Crowell & Moring LLP

(57) ABSTRACT

A control apparatus for operating an electric drive for a vehicle may include one or more power modules, which have one or more power semiconductors; an intermediate circuit capacitor, which is connected in parallel to the power module(s); a cooler for dissipating heat generated by the power module(s); and an interconnect device for obtaining electrical contact to the power module(s), wherein the cooler extends over at least two main planes forming an angle to one another.

16 Claims, 4 Drawing Sheets

(56) References Cited

U.S. PATENT DOCUMENTS

| | | | | |
|---|---|---|---|---|
| 2007/0096278 A1* | 5/2007 | Nakatsu | ............... | H01L 25/072 |
| | | | | 257/678 |
| 2007/0217241 A1* | 9/2007 | Obu | ..................... | H02M 7/003 |
| | | | | 363/141 |
| 2011/0221268 A1* | 9/2011 | Kanazawa | ........... | H05K 1/0263 |
| | | | | 307/10.1 |
| 2011/0242770 A1* | 10/2011 | Yamanaka | ........... | H05K 7/1432 |
| | | | | 361/728 |
| 2011/0286185 A1* | 11/2011 | Abe | ..................... | H02M 7/003 |
| | | | | 361/710 |
| 2012/0007530 A1* | 1/2012 | Imai | ..................... | H02M 7/003 |
| | | | | 318/400.25 |
| 2013/0044434 A1* | 2/2013 | Sharaf | .................. | H02M 7/493 |
| | | | | 361/702 |
| 2018/0013355 A1* | 1/2018 | Tokuyama | .............. | H01L 23/48 |
| 2018/0303001 A1 | 10/2018 | Suwa et al. | | |
| 2020/0006197 A1* | 1/2020 | Hart | ....................... | H01L 23/40 |

\* cited by examiner

US 11,413,969 B2

CONTROL APPARATUS FOR OPERATING AN ELECTRIC DRIVE FOR A VEHICLE AND METHOD OF MANUFACTURING SUCH A CONTROL APPARATUS

RELATED APPLICATION

This application claims the benefit of, and priority to, German Patent Application DE 10 2019 214 789.5, filed Sep. 26, 2019, which is incorporated by reference herein in its entirety.

TECHNICAL FIELD

The present disclosure relates to the field of electromobility, in particular the control apparatuses for operating an electric drive for a vehicle.

BACKGROUND

Control apparatuses, in particular integrated control apparatuses, e.g. DC/AC inverters (inverter), are increasingly used in motor vehicles. DC/AC inverters are used to supply electric machines such as electric motors with a multiphase alternating current. A direct current generated by a DC energy source, such as a battery, is converted to a multiphase alternating current. For this purpose, the control apparatuses comprise one or more power modules comprising bridge circuits (such as half bridges). The power modules are based on power semiconductors, in particular transistors such as MOSFETs and HEMTs. These power semiconductors are connected to a interconnect devices, in particular a printed circuit board, for activation purposes.

To avoid complex integrated circuit packaging (ICP) and thus reduce production costs for the inverter, combined interconnect devices are used both to activate a drive (driver) as well as for control (control). Such combined interconnect devices are known as combined control and driver boards (CCDB). This reduces the need for plug-in connectors between the various parts (driver and control parts) of the interconnect devices, but has the disadvantage that when operating the power module by conducting higher currents and through quick switching of the power semiconductors, high interference emissions are generated that feed into the CCDB. This increases the need for additional filtering, in order to obtain a operation of the inverter in accordance with the intended use. Furthermore, known inverters are associated with increased costs and reduced power output.

An integrated control apparatus in the form of an inverter is known from DE 10 2016 202 547 A1. The control apparatus comprises an interconnect device that comprises a first section for driver activation, and a second section for control, wherein the first section and second section are connected to one another by a flexible third section. The known control apparatus has the disadvantage, in addition to high interference, that the number of power modules that can be attached to the cooler is limited, and therefore, the power density of the inverter is limited.

Furthermore, the power modules therein and their connections to a cooler are adjacent to one another in a plane. This results in the disadvantage that the module arrangement is elongated, and a cooler and inverter construction in the lateral direction is very space consuming. This makes it more difficult to integrate the overall structure in existing installation spaces.

An object of the embodiments discussed below is therefore to create a control apparatus in which the disadvantages described above have been at least partially overcome.

BRIEF DESCRIPTION OF THE DRAWINGS

Embodiments shall now be described merely by way of example, and in reference to the attached drawings. Therein.

DETAILED DESCRIPTION

Figure 1:
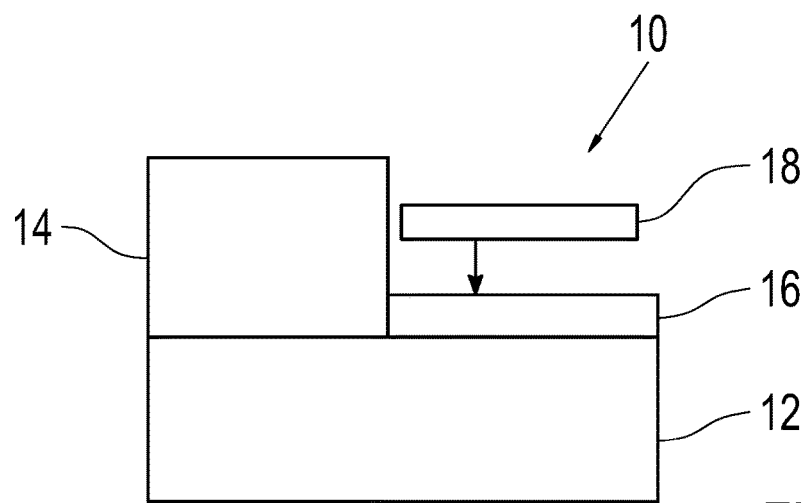
FIG. 1 shows a schematic illustration of a control apparatus according to an embodiment, in a top view.

The control apparatus in the framework of this disclosure is used for operating an electric drive for a vehicle, in particular an electric vehicle, and/or a hybrid vehicle. The control apparatus preferably comprises a DC/AC inverter (Eng.: inverter), or a part thereof. In particular, the control apparatus is used to supply power to an e-machine, e.g. an electric motor and/or a generator. A DC/AC inverter is preferably used to generate a multiphase alternating current from a direct current generated from a DC voltage of an energy source, e.g. a battery.

The control apparatus basically has one or more power modules, an intermediate circuit capacitor, a cooler, and an interconnect device. In addition, the control apparatus can have an input connection for supplying an input current generated with an energy source and an output connection for outputting an output current generated with the input current. With respect to the input current, the power module(s) and the intermediate circuit capacitor can be connected in parallel.

The respective power module is based on power semiconductors with which a bridge circuit assembly is preferably formed. The bridge circuit assembly can comprise one or more bridge circuits in the form of half bridges. Each half bridge comprises a high side switch (HSS) and a low side switch (LSS) connected in series to the high side switch. Each half bridge is assigned to one current phase of a multiphase alternating current (output current).

The HSS and/or LSS comprise one or more power semiconductor components, e.g. IGBTs, MOSFETs or HEMTs. The semiconductor material forming the basis for the HSS or LSS preferably comprises a so-called wide-bandgap semiconductor (semiconductor with a wide bandgap) such as SiC or GaN.

The bridge circuit is attached to the interconnect device. The interconnect devices each preferably comprise a printed circuit board (PCB) and preferably form a combined control and driver board (CCDB). Alternatively, the interconnect devices can have an additional ceramic substrate.

The first sections and the second sections of the interconnect devices can each form an independent interconnect device. In this case, this is an interconnect device assembly that comprises a first interconnect device and a second interconnect device.

The cooler is used to dissipate the heat generated by the power semiconductors, and thus prevent an overheating of the control apparatus. The cooler preferably comprises a metal heat sink, preferably made of aluminum, to which the power modules are thermally coupled. One or more heat conductor layers can likewise be placed between the power modules and the heat sink to reduce the thermal resistance between the power modules and the cooler, which is relatively high due to an air gap formed therebetween.

The connections between the power module(s) and the interconnect device, and/or between the interconnect device and the cooler are preferably obtained in the form of an adhesive, screw, welded, plug-in and/or clamp connection.

The control apparatus can form a three-phase system for converting the input current into a three-phase alternating current, or a six-phase system for converting the input current into a six-phase alternating current.

The cooler extends in at least two main planes forming an angle to one another. The main plane in the present case is a plane in which the cooler has at least in part the largest surface (main surface). By way of example, the cooler can comprise two sections that each extend along a main plane, wherein the two main planes are at a predefined angle to one another. The power modules are preferably attached to the main surfaces along the main planes in order to ensure an effective and uniform heat dissipation from the power modules to the cooler.

As a result, interference fields that can be traced back to the high input current levels and the quick switching of the power module(s), and which spread out substantially parallel to the flat power module(s), are input less into the interconnect devices. This improves the functionality of the control apparatus. Furthermore, there is no need for additional filtering in order to compensate for the interference. This reduces the production costs for the control apparatus and improves its switching behavior.

Furthermore, because the cooler extends along numerous main planes, the lateral extension of the inverter is strongly reduced. This favors a balanced expansion of the overall structure in different spatial directions. As a result, the integration is optimized in existing, limited installation spaces. Numerous half bridges, e.g. B6 bridges, can be integrated in the control apparatus. This results in an increased power density inside existing, limited installation spaces for the control apparatus.

Advantageous embodiments and further developments are described in the dependent claims.

According to one embodiment, the cooler has at least three sections, each of which extend along one of three main planes at angles to one another.

This increases the cooling surface area of the cooler without requiring more installation space. The cooling power of the cooler can therefore be transferred particularly effectively.

According to another embodiment, the at least three sections of the cooler define a cube.

In this case, the angles are selected such that each of the adjacent sections of the cooler are at right angles to one another. Such a construction has a defined, basic structure, which facilitates integration of the control apparatus, or inverter, respectively, in the vehicle, or electric drive.

According to another embodiment, each of the three sections of the cooler is populated on both sides with numerous power modules along the respective main planes.

This increases the efficiency of the cooling surfaces of the cooler, without requiring additional installation space. The cooling effect is therefore improved.

According to another embodiment, the interconnect device extends along a plane that is substantially perpendicular to the main planes of the cooler.

The interconnect device is preferably a flat printed circuit board, which extends along a plane that is perpendicular to the main planes of the cooler. Preferably, the circuit board and the different sections of the cooler collectively form a cube.

According to another embodiment, the intermediate circuit capacitor is located in an interior space defined by the main planes of the cooler.

In addition to a simplified contact to the intermediate circuit capacitor, this enables an efficient use of the available installation space. The inverter can therefore be compact.

The same reference symbols indicate parts with identical or similar functions in the figures. The respective relevant parts are labeled in the individual figures.

FIG. 1 shows a schematic illustration of a control apparatus 10, preferably in the form of an inverter. The control apparatus 10 has an active cooler 12, a power module 16, an intermediate circuit capacitor 14, and an interconnect device 18. There can also be a connection for supplying the input voltage, or input current, from a battery and/or for outputting the AC voltage or alternating current to the electric drive (e.g. an electric motor). The positioning of the various components of the control apparatus 10 shown in FIG. 1 is purely schematic, and not to be regarded as being to scale.

Figure 2:
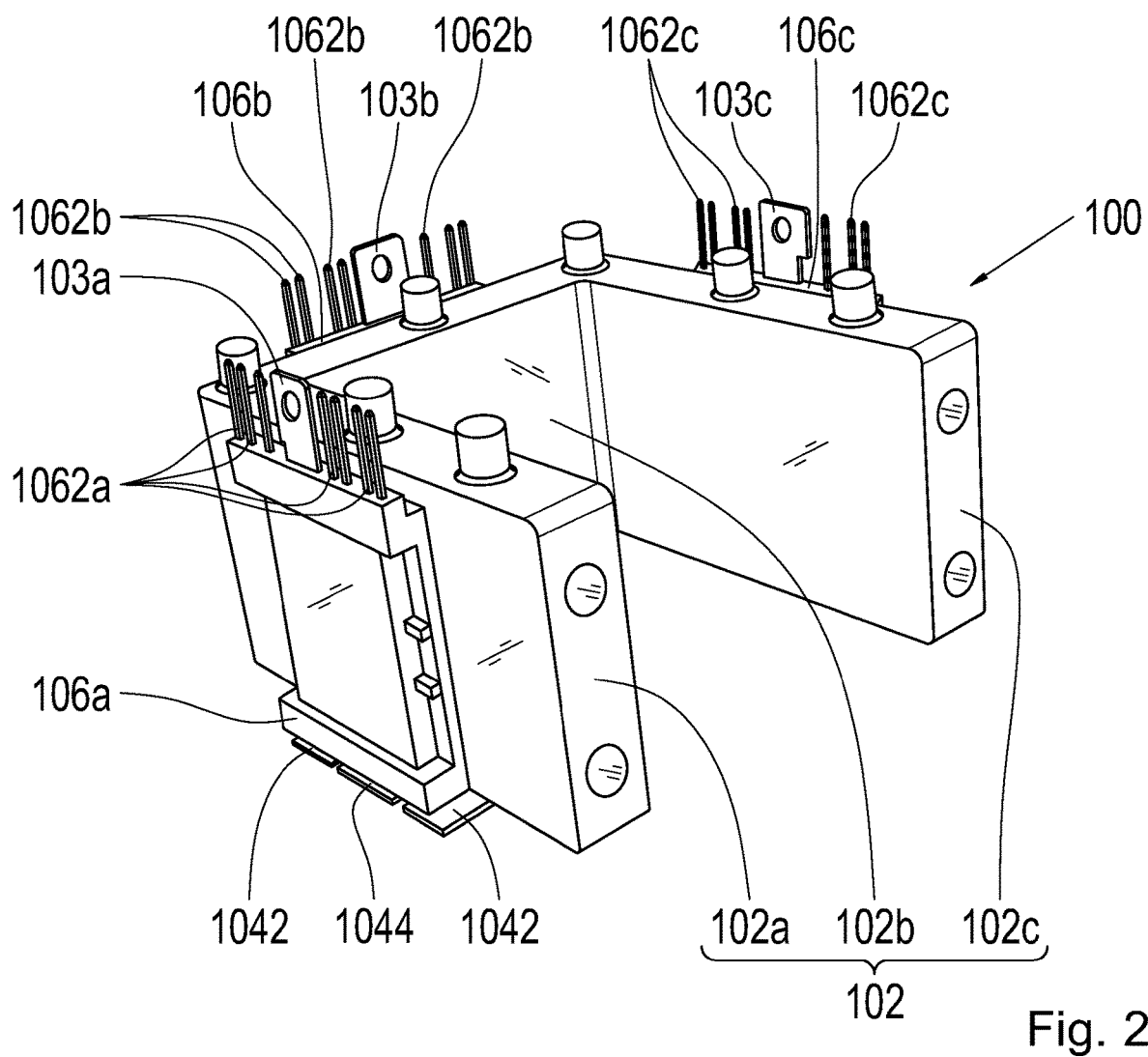
FIG. 2 shows a schematic illustration of a control apparatus according to another embodiment.
Figure 3:
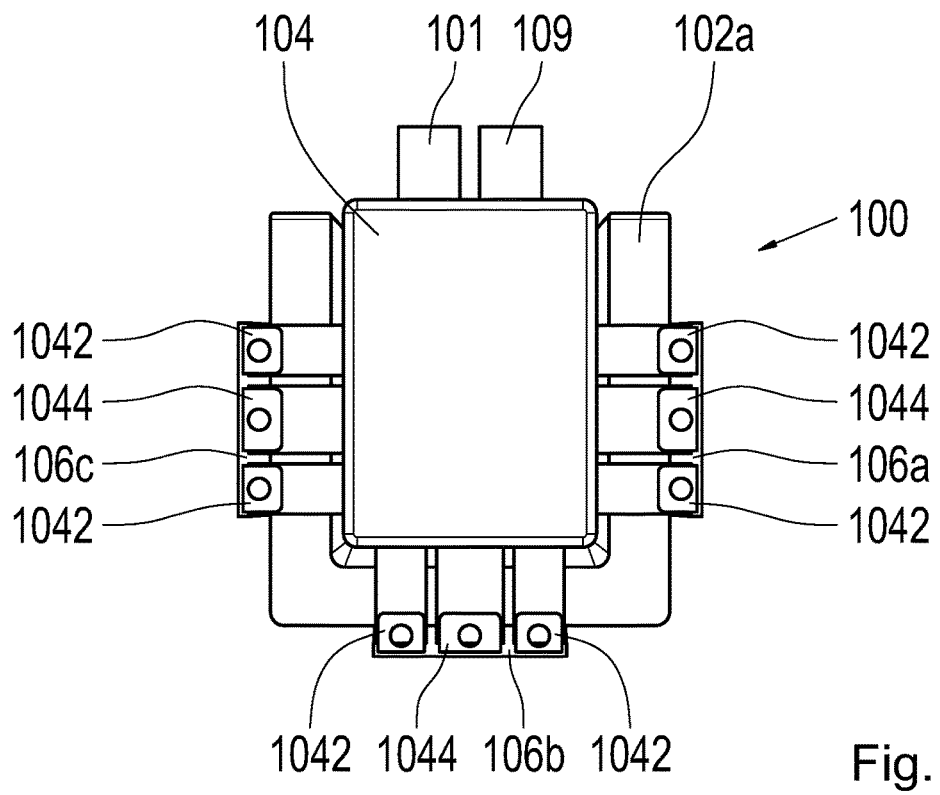
FIG. 3 shows another schematic illustration of the control apparatus in FIG. 2.
Figure 4:
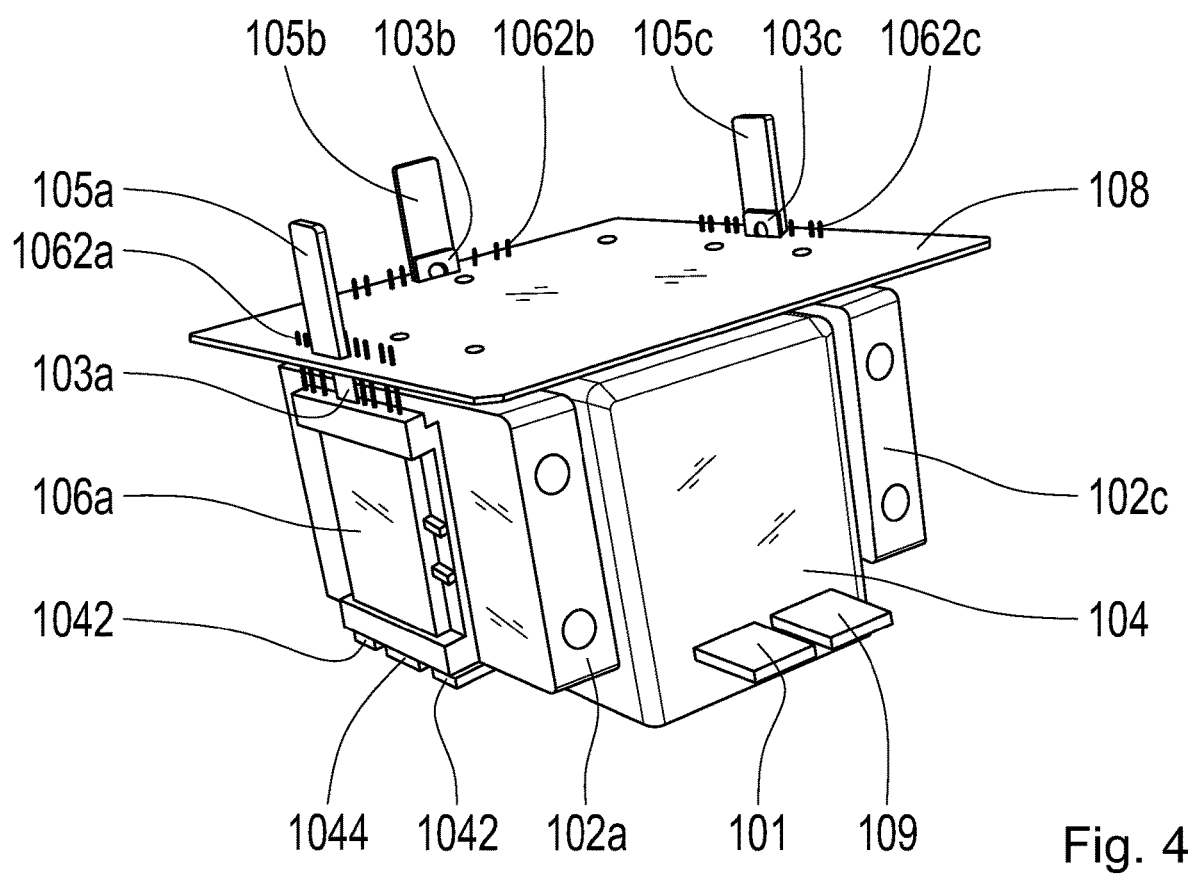
FIG. 4 shows another schematic illustration of the control apparatus in FIG. 2.

FIGS. 2-4 each show a schematic illustration of a control apparatus 100 according to another embodiment. The control apparatus 100 substantially comprises the same components, specifically the active cooler 102, numerous power modules 106a-c, the intermediate circuit capacitor 104, and the interconnect device 108. The intermediate circuit capacitor 104 and the interconnect device 108 are not shown in FIG. 2. FIG. 2 and FIG. 4 each show a perspective view of the control apparatus 100, whereas in FIG. 3, the control apparatus 100 is shown from a perspective from below with respect to the perspectives shown in FIGS. 2 and 4.

The cooler 102 comprises three sections 102a-c, each of which extends along a main plane, wherein the first section 102a is connected the second section 102b, and the second section 102b is connected to the third section 102c, in each case forming a right angle. This U-shaped structure allows the control apparatus 100 to assume the shape of a cube. A power module 106a-c is attached to each section 102a-c on an outer surface of the cooler 102. This makes it easier to install the control apparatus 100. By way of example, the creation of a connection between the intermediate circuit capacitor 104 and the power modules 106a-c is simplified. As FIGS. 3 and 4 show, the intermediate circuit capacitor 104 is located in an interior space of the cooler 102 encompassed by the three sections 102a-c, and thus on an inner surface of the cooler 102 facing away from the outer surface. The intermediate circuit capacitor 104 forms a cube. Alternatively, the intermediate circuit capacitor 104 can be radially symmetrical with respect to the vertical extension of the control apparatus 100.

A least one bridge circuit is incorporated in each of the power modules 102a-c, which comprises two power switches composed of a high side switch (HSS) and a low side switch (LSS). There are numerous connections 1062a-c for activating the numerous power switches on each power module 102a-c. The intermediate circuit capacitor 104 also comprises numerous positive contacts 1042 and negative contacts 1044 for supplying an input current, supplied by two inputs 101, 109 (see FIG. 3) from the battery, from the intermediate circuit capacitor 104 to the power modules 106a-c. The input connections 101, 109 are located on a side of the intermediate circuit capacitor 104 to which no current phase is assigned. Each of the power modules 106a-c are assigned one of three current phases. Accordingly, each power module 106a-c comprises a connection 103a-c for outputting the phase currents generated on the basis of the input current.

The interconnect device 108 is also shown in the form of a printed circuit board in FIG. 4, which then is placed on the interior space defined by the three sections 106a-c in the perspective view shown from above. There are numerous holes in the printed circuit board 108, through which the connections 1062a-c and 103a-c pass. There are also numerous adapters 105a-c, which supply the phase currents to the load, e.g. the electric drive in the form of an electric motor. The printed circuit board 108 is therefore perpendicular to the main planes of the cooler 102, and thus to the power modules 106a-c on the cooler 102. As a result of the perpendicular orientation, the printed circuit board, which preferably contains a combined control and driver board (CCDB), is less vulnerable to the interferences emitted from the power modules 106a-c. This increases the immunity of the control apparatus 100 to its own interferences. The need for external filtering is reduced, and optimizes power output of the control apparatus 100.

Figure 5:
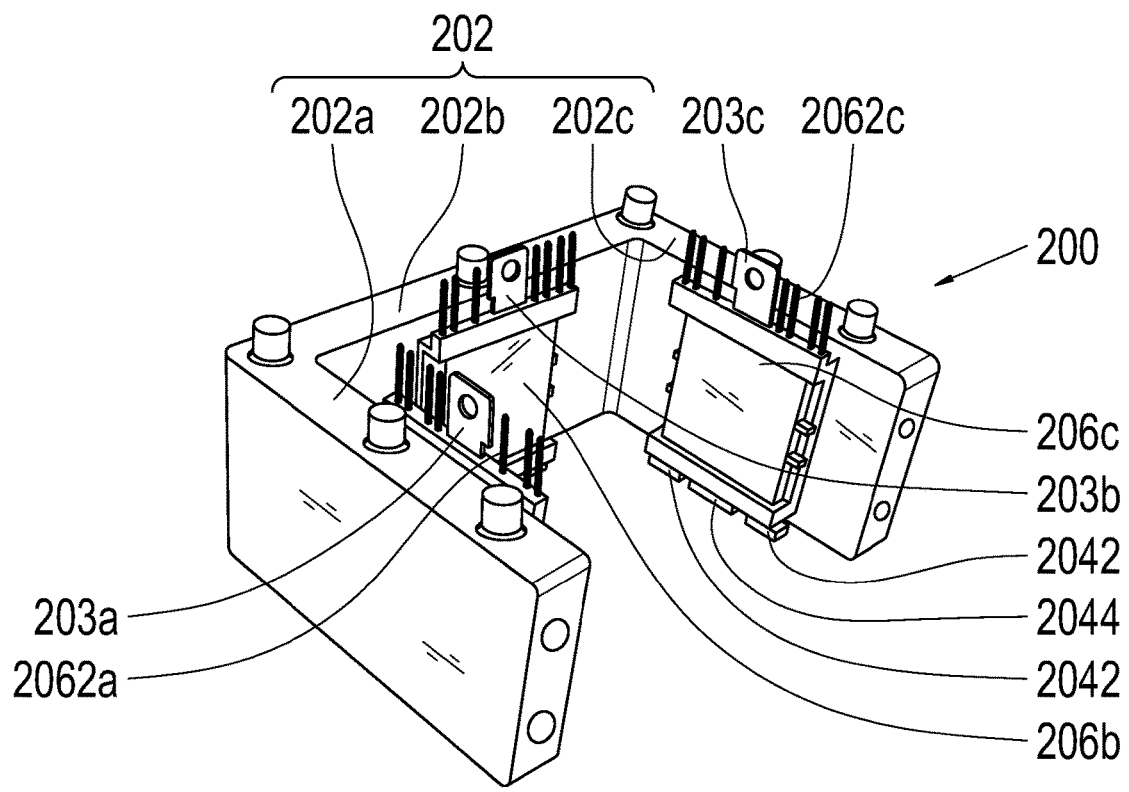
FIG. 5 shows a schematic illustration of a control apparatus according to another embodiment.

FIG. 5 shows a schematic illustration of a control apparatus 200 according to another embodiment. As in FIG. 2, only part of the control apparatus 200 is shown. The construction of the control apparatus 200 in FIG. 5 is similar to that in FIG. 2. The difference is that the power modules 206a-c are placed on the inside of the cooler 202 instead of the outside. This internal placement of the power modules 206a-c results in the advantage of a particularly short and symmetrical connection of DC connections in the power modules 206a-c to the intermediate circuit capacitor 204.

Figure 6:
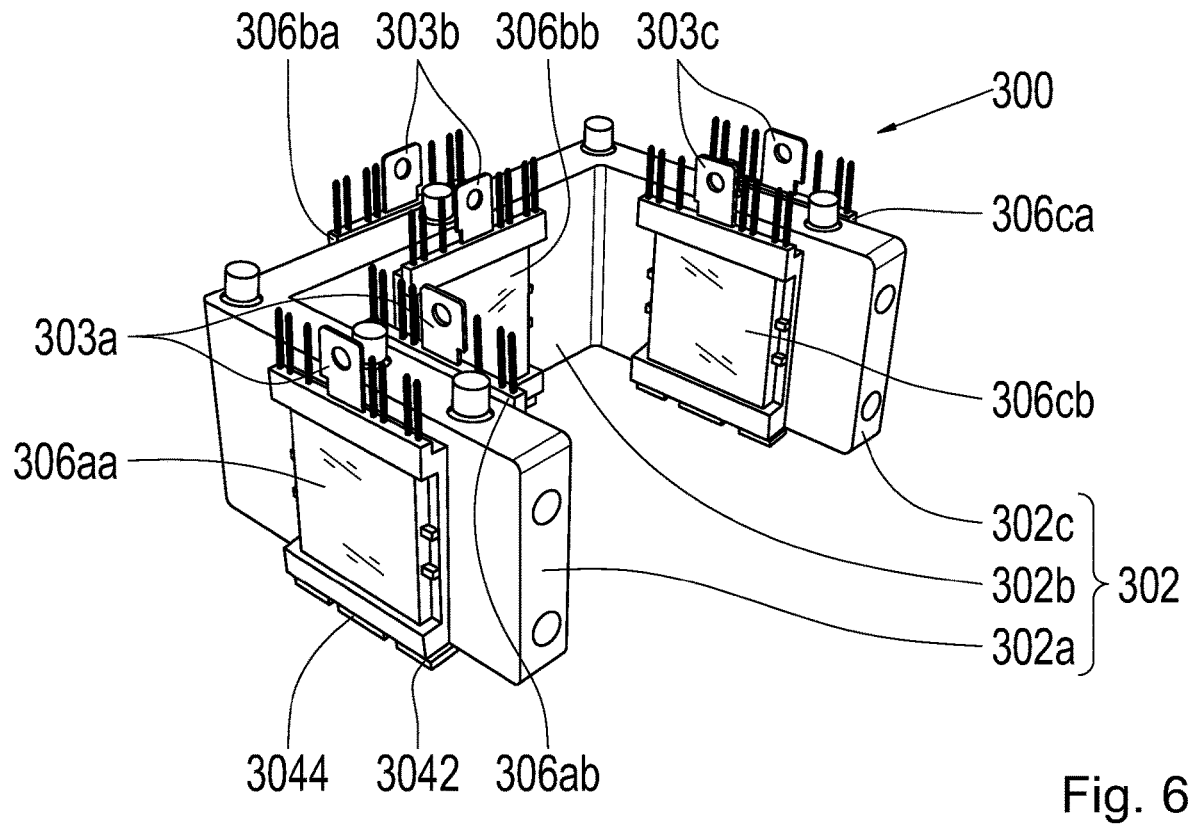
FIG. 6 shows a schematic illustration of a control apparatus according to another embodiment.

FIG. 6 shows a schematic illustration of a control apparatus 300 according to another embodiment. As in FIG. 2, only part of the control apparatus 300 is shown. The construction of the control apparatus 300 in FIG. 6 is similar to that in FIG. 2. The difference is that six, instead of three, power modules 306aa-cb are located on both the outside and the inside of the cooler 202. Two power modules 306aa, ab, 306ba, bb, and 306ca, cb are attached to each section 302a-c of the cooler 302, which are placed on opposite sides of the respective sections 302a-c. This construction represents an opportunity for saving space to obtain an inverter with very high performance requirements.

Figure 7:
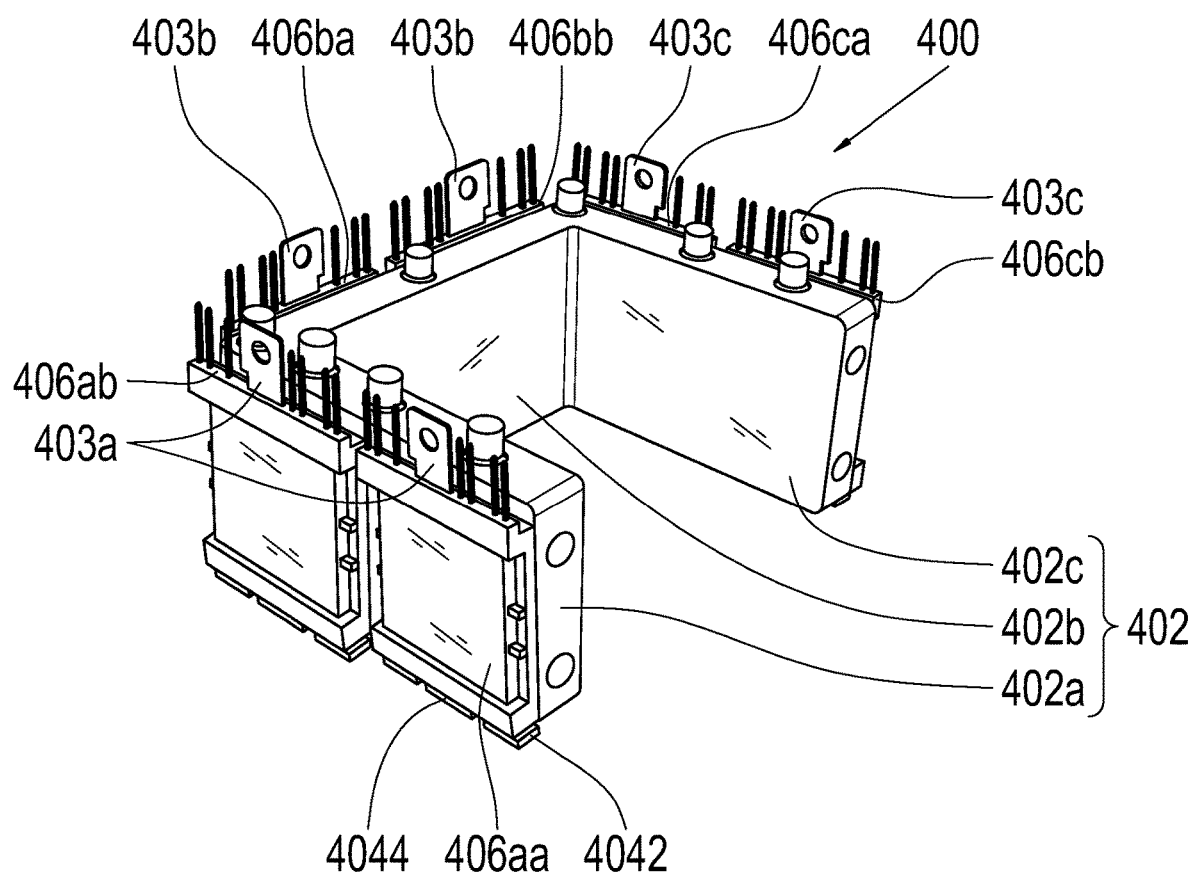
FIG. 7 shows a schematic illustration of a control apparatus according to another embodiment.

FIG. 7 shows a schematic illustration of a control apparatus 400 according to another embodiment. As in FIG. 2, only part of the control apparatus 400 is shown. The construction of the control apparatus 400 in FIG. 7 is similar to that in FIG. 2. The only difference is that six, instead of three, power modules 406aa-cb are located on the outside of the cooler 202. There are two power modules 406aa, ab, 406ba, bb, and 406ca, cb attached to each section 402a-c of the cooler 402 such that they are on the outside of the respective sections 402a-c. This construction increases the power output and facilitates installation of the inverter.

Numerous half bridges, e.g. B6 bridges, can be obtained in the power modules contained in the control devices 10, 100, 200, 300, 400. As a result, the control apparatus, or inverter, can be scaled to a large extent, and a high power output can be obtained. The power densities of the inverter are therefore increased.

REFERENCE SYMBOLS 10,100, 200, 300, 400 control apparatus
12,102,202,302,402 cooler
102a-c, 202a-c, 302a-c, 402a-c cooler sections
103a-c, 203a-c, 303a-c, 403a-c connections
14, 104, 204, 304, 404 intermediate circuit capacitor
1042, 2042, 3042, 4042 positive contact
1044, 2044, 3044, 4044 negative contact
16, 106a-c, 206a-c, 306aa-cb, 406aa-cb power module
1062a-c, 2062a-c connections
18, 108 interconnect device (printed circuit board)

We claim:

1. A control apparatus for operating an electric drive for a vehicle, comprising:
   one or more power modules, wherein each of the one or more power modules includes one or more power semiconductors;
   an intermediate circuit capacitor, wherein the intermediate circuit capacitor is connected in parallel to a first power module of the one or more power modules;
   a cooler for dissipation of heat generated by the one or more power modules; and
   an interconnect device for obtaining electrical contact to the first power module,
   wherein the cooler includes a first section, a second section, and a third section,
   wherein the first section and the third section include cooling surfaces parallel to a first main plane, and
   wherein the second section extends from the first section to the third section and includes a cooling surface parallel to a second main plane,
   wherein the first main plane forms an angle relative to the second main plane,
   wherein the first main plane is perpendicular relative to the second main plane, and
   wherein at least one power module of the one or more power modules is attached to each of the three sections.

2. The control apparatus according to claim 1, wherein the cooler forms a U-shaped structure configured for surrounding three sides of a cube.

3. The control apparatus according to claim 1, wherein the first power module is attached to an inside of the respective section facing the intermediate circuit capacitor.

4. The control apparatus according to claim 1, wherein the first power module is attached to an outside of the section facing away from the intermediate circuit capacitor.

5. The control apparatus according to claim 1, wherein each of the three sections of the cooler is populated on both sides along the respective main planes with at least one power module of the one or more power modules.

6. The control apparatus according to claim 1, wherein the interconnect device extends along a plane that is substantially perpendicular to the main planes of the cooler.

7. The control apparatus according to claim 1, wherein the intermediate circuit capacitor is located in an interior space defined by the main planes of the cooler.

8. A control apparatus for operating an electric drive for a vehicle, comprising:
   a first power module that includes at least one power semiconductor;
   an intermediate circuit capacitor, wherein the intermediate circuit capacitor is connected in parallel to the first power module;
   a cooler for dissipation of heat generated by the first power module; and an interconnect device for obtaining electrical contact to the first power module, wherein the cooler includes a first section, a second section, and a third section, wherein the first section and the third section include cooling surfaces parallel to a first main plane, and wherein the second section extends from the first section to the third section and includes a cooling surface parallel to a second main plane, wherein the first main plane forms an angle relative to the second main plane, wherein the cooler forms a U-shaped structure configured for surrounding three sides of a cube, and wherein each of the three sections of the cooler is populated on both sides along the respective main planes with at least one power module.

9. The control apparatus according to claim 8, wherein the first main plane is perpendicular relative to the second main plane.

10. The control apparatus according to claim 8, wherein at least one power module is attached to each of the three sections.

11. The control apparatus according to claim 10, wherein the first power module is attached to an inside of the respective section facing the intermediate circuit capacitor.

12. The control apparatus according to claim 10, wherein the first power module is attached to an outside of the section facing away from the intermediate circuit capacitor.

13. The control apparatus according to claim 8, wherein the interconnect device extends along a plane that is substantially perpendicular to the main planes of the cooler.

14. The control apparatus according to claim 8, wherein the intermediate circuit capacitor is located in an interior space defined by the main planes of the cooler.

15. A method, comprising:

forming a control apparatus for operating an electric drive for a vehicle, wherein the control apparatus includes:

a first power module that includes at least one power semiconductor;

an intermediate circuit capacitor, wherein the intermediate circuit capacitor is connected in parallel to the first power module;

a cooler for dissipation of heat generated by the first power module; and an interconnect device for obtaining electrical contact to the first power module, wherein the cooler includes a first section, a second section, and a third section, wherein the first section and the third section include cooling surfaces parallel to a first main plane, and wherein the second section extends from the first section to the third section and includes a cooling surface parallel to a second main plane, wherein the first main plane forms an angle relative to the second main plane, wherein the cooler forms a U-shaped structure configured for surrounding three sides of a cube, and wherein each of the three sections of the cooler is populated on both sides along the respective main planes with at least one power module.

16. The method of claim 15, further comprising installing the control apparatus in the vehicle.

\* \* \* \* \*